United States Patent [19]

Powell et al.

[11] Patent Number: 4,701,921
[45] Date of Patent: Oct. 20, 1987

[54] MODULARIZED SCAN PATH FOR SERIALLY TESTED LOGIC CIRCUIT

[75] Inventors: Theo J. Powell, Dallas; Yin-Chao Hwang, Sugar Land, both of Tex.

[73] Assignee: Texas Instruments Incorporated, Dallas, Tex.

[21] Appl. No.: 790,541

[22] Filed: Oct. 23, 1985

[51] Int. Cl.⁴ ............................................. G01R 31/28
[52] U.S. Cl. ................................... 371/25; 324/73 R
[58] Field of Search ................. 371/25, 15; 324/73 R, 324/73 AT

[56] References Cited

U.S. PATENT DOCUMENTS

| | | | |
|---|---|---|---|
| 4,441,075 | 4/1984 | McMahon | 324/73 R |
| 4,503,537 | 3/1985 | McAnney | 371/25 |
| 4,519,078 | 5/1985 | Komonytsky | 371/25 |
| 4,534,028 | 8/1985 | Trischler | 371/25 |
| 4,580,137 | 4/1986 | Fiedler et al. | 371/25 X |
| 4,597,042 | 6/1986 | d'Angeac et al. | 364/200 |

OTHER PUBLICATIONS

Generalized Scan Test Technique for VLSI Circuits, IBM Technical Disclosure Bulletin, vol. 28, No. 4, Sep. 1985, pp. 1600–1604.

*Primary Examiner*—Charles E. Atkinson
*Attorney, Agent, or Firm*—John G. Graham; Rodney M. Anderson

[57] ABSTRACT

A modularized scanned logic test system includes modularized logic circuits (26) having control/observation locations therein. Each of the control/observation locations has a shift register latch (SRL) disposed thereat. A common scan data in line (28) provides data to a serial input to each of the modules (26). The serial output of each of the modules (26) is interfaced with a scan data out line (30). An address on a bus (16) is provided to a decoder (52) to select one of the modules (26). An isolation gate (48) allows for input of data to only the select one of the modules (26) and an isolation gate (50) allows output of data only from the select one of the modules (26) to the scan data out line (30).

16 Claims, 12 Drawing Figures

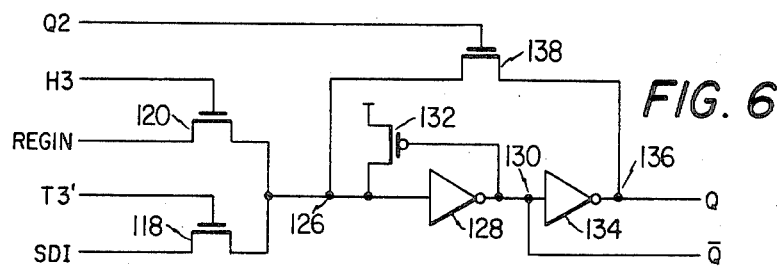
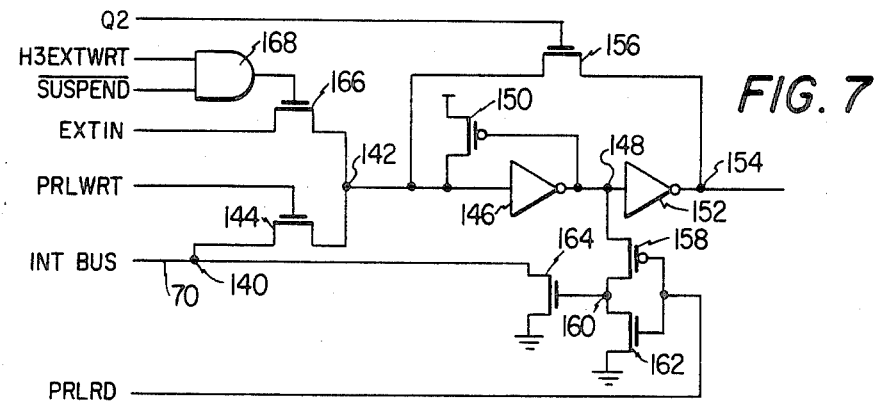
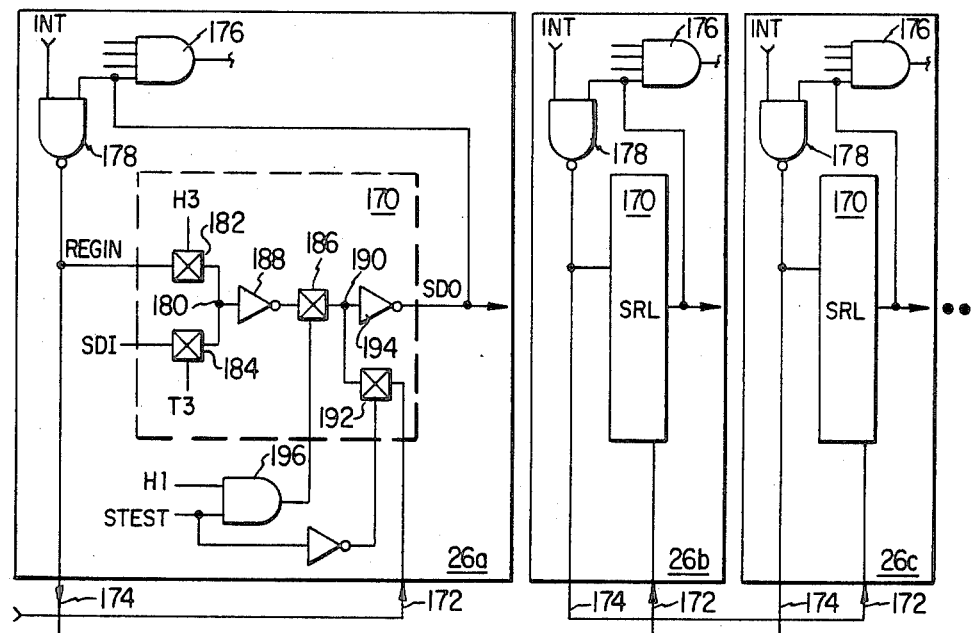

MODULARIZED SCAN PATH FOR SERIALLY TESTED LOGIC CIRCUIT

TECHNICAL FIELD OF THE INVENTION

The present invention pertains in general to testing of very large scale integrated circuits, and more particularly, to utilization of scan testing techniques in defined test boundaries within a partitioned system.

CROSS REFERENCE TO RELATED APPLICATIONS

This application is related to patent application Ser. No. 790,569, filed Oct. 23, 1985, Ser. No. 790,543, filed Oct. 23, 1985 and Ser. No. 790,598, filed Oct. 23, 1985.

BACKGROUND OF THE INVENTION

Several programs have been underway to increase the density of integrated circuits. One of these programs, the very high speed integrated circuit (VHSIC) program, is directed toward delivering electronics utilizing very large scale integrated circuit (VLSI) techniques to provide more advanced and smarter systems. Some of the older VLSI programs have a performance specification of five $\times 10^{13}$ gate-Hz/cm$^2$ functional throughput rates. In order to achieve this type of performance, lithographic equipment that draws ultrafine lines must be built, and the requisite packages created. These chips will have features as small as 0.5 micrometers which can result in a chip having between 20,000 to 40,000 gates and 100,000 to 400,000 transistors on chips ranging as large as 0.25 square inches. They will be mounted on carriers having between 150 to 400 pins.

One of the largest challenges to developing a high density VLSI devices is testing. Because of the complex circuit functions and/or large quantities of circuit functions that may be present in a VLSI circuit, or in a system that employs VLSI circuits, testing methods have themselves become very sophisticated and complex. In addition, complex test methods generally require corresponding complex equipment, including software, and become increasingly expensive and burdensome to carry out. However, in order to ensure a relatively high degree of reliability for a given chip design, it is necessary to design for testing to ensure that a high percentage of the faults are detectable. Present goals for fault detections are 98% or greater.

One of the best known test methods for testing large scale integrated circuits is level sensitive scan design (LSSD) which is well described in the literature. See U.S. Pat. No. 4,519,078, issued to Donald Komonytsky and assigned to Storage Technology Corporation for a general description of LSSD. See also U.S. Pat. No. 4,428,060, issued to A. Blum and assigned to International Business Machines, and E. J. McCluskey, "A Survey of Design for Testability Scan Techniques", VLSI Design, Dec. 1984, pp. 38–61, for a comprehensive list of patents and publications for the testing of electronic structures. Basically, LSSD utilizes a plurality of controllabilty/observability points internal to an LSI circuit. Controllability is provided by allowing data to be shifted into these points which are comprised of shift register latches (SRL's) in a serial manner. A test is then performed and then the data stored in the SRL's and shifted back out for observation thereof. Therefore, control/observation of an LSI circuit no longer depends on the number of pins in the package. Furthermore, because the latches themselves are part of the internal circuit, they can be utilized to break feedback paths in a sequential circuit, enabling the test for the combinational circuits between SRL's to be generated automatically.

In a typical scan design, the shift registers are located at specific points required for the design function but are connected together in a scan chain for testing purposes. The scan chain allows for realization of any test state in the registers for test application. A test pattern is then generated on a computer. The generated test pattern is then shifted into the SRL's, test vectors (selected words or groups of digital data) applied to the primary inputs or pins of the chip, the system clocks applied to perform the test, the primary output pins compared to expected vector outputs and data scanned out of the SRL's to compare it to known good test vectors. In performing this test, numerous series of test vectors are usually required for shifting into the SRL's, applying the test vectors and then shifting the results back out. This becomes somewhat time consuming when applying these tests on a conventional tester.

In conventional scan designs, the SRL's are connected in a continuous string, as illustrated in U.S. Pat. No. 4,519,078, or implemented in a parallel manner, as illustrated in U.S. Pat. No. 4,503,537, issued to William McAnney and assigned to International Business Machines Corporation. In the sequential design, a predetermined amount of time is required to test a given chip. The amount of time required to shift data into the SRL's to perform the test and shift the data out is determined by the number of SRL's in the serial chain. If only one function of the chip were to be tested, data would have to be shifted through all of the shift registers in the chain in order to test this function. For example, if a chip had multiple functions and one function required loading and unloading of the shift registers four times as compared to another function which required loading and unloading of the SRL's six times to perform the appropriate test, the shift registers for the first function would have to be loaded and unloaded an additional two times to perform the final two passes for the test pattern of the second function. The time required to shift through the registers in the first function for these additional two passes is wasted time. In addition to the additional time, additional logic is required to connect the registers together. This is true even if the registers can be more easily loaded and unloaded using the normal logic flow. This extra logic can become a primary disadvantage, especially if the registers are connected to buses.

In view of the above disadvantages, there exists a need for a test method which utilizes scan techniques that reduce the time required to scan data into the control/observation points and also reduced the time for generation of the test patterns.

SUMMARY OF THE INVENTION

The present invention disclosed and claimed herein comprises a method and apparatus for testing a logic circuit. The logic circuit is divided into a plurality of modules with a defined test boundary each having internal logic associated therewith. The logic has associated control/observation locations at which shift register latches are disposed. Each of the latches has a test input, a normal input and an output. The normal input and the output are interfaced with a logic circuit during normal operation while the test input and output are interfaced with a serial test chain during test. The serial chain is interfaced with a serial input and a serial output on each of the modules. Each of the modules are interfaced with a common serial input and a common serial output for the circuit. Selection of the modules is provided by an address bus which receives an external module address and controls the interface to allow input of test vectors to the select one of the modules for storage thereof. These test vectors are then applied and results stored in the shift register latches. After storage of the results, the results are scanned out of the serial module output of the select one thereof to the common serial output. The unselected modules have the outputs inhibited such that results are output only from the select module.

BRIEF DESCRIPTION OF THE DRAWINGS

For a more complete understanding of the present invention and the advantages thereof, reference is now made to the following description taken in conjunction with the accompanying Drawings in which:

FIG. 6 illustrates a schematic diagram of the SRL's;

FIG. 7 illustrates a schematic diagram of the PRL's;

FIG. 8 illustrates a schematic block diagram of a transparent SRL;

DETAILED DESCRIPTION OF THE INVENTION

Test Partitioned Logic Circuit

Figure 1:
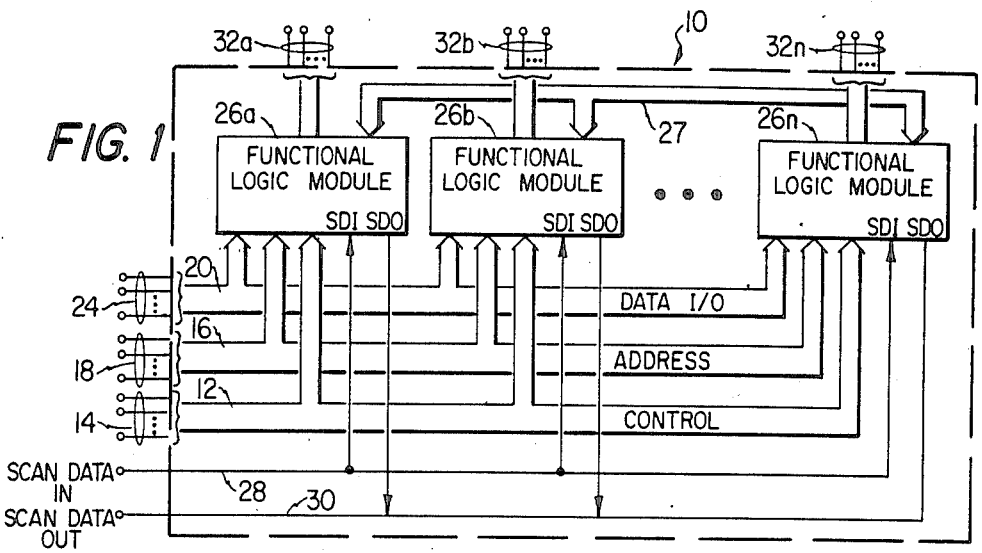
FIG. 1 illustrates a schematic block diagram of an VLSI chip configured in the test mode with multiple logic modules.

Referring now to FIG. 1, there is illustrated a block diagram of a test partitioned very large scale integrated (VLSI) circuit 10. The VLSI circuit 10 can be configured in an operational mode and a test mode, the configuration for the test mode being illustrated in FIG. 1. Generally, in the operational mode of a VLSI circuit, functions are normally partitioned or "modularized". These circuits can operate in any number of modes with different modules providing control functions, storage functions, etc. These modules are generally interfaced with the exterior of the circuit through device pins to provide an interface for data, addresses and control signals. Through the use of various multiplexing circuits, the pin functions can be changed and even the internal architecture of the device.

In the test mode an internal control bus 12 is interfaced with pins 14 for control functions such as clock signals, test signals and various other control signals. An internal address bus 16 is interfaced with pins 18 to allow input of addresses to the LSI circuit 10. An internal data input/output (I/O) bus 20 is interfaced with pins 24 to allow bidirectional data flow. It should be understood that the buses 12, 16, and 20 are only interfaced with the device pins 14, 18 and 24, respectively, during the test mode. In the operational mode of the VLSI circuit 10, these pins may have other functions depending upon the particular application.

The logic in the chip 10 is segmented into functional logic modules 26a-26n. The logic is a combination of both combinatorial logic and sequential logic. Each of the functional modules 26a-26n are interfaced with the control bus 12, the address bus 16 and the I/O bus 20 in the test mode. The address bus 16 allows for addressing separate ones of the modules 26a-26n and the I/O bus 20 allows for interface of parallel data therewith. The control signals for controlling all of the modules 26a-26n are provided through the control bus 12. To provide for interface between the modules in the operational mode, an operational bus 27 is provided for carrying signals between various modules. These signals are in addition to address, data and control information carried on buses 12, 16 and 18. In the configuration of FIG. 1, the external pins of the chip are internally interfaced such that the internal logic of the chip is accessible externally to provide control over the testing procedure.

Each of the modules 26a-26n is also provided with a scan data in port (SDI) and a scan data out port (SDO). The SDI port is interfaced with a common scan data in line 28 and the SDO port is interfaced with a common scan data out line 30. The scan data in line 28 is connected to an external pin for receiving serial data and the scan data out line 30 is interfaced with an external pin for outputting serial data.

Each of the modules 26a-26n provide a defined test boundary for the functional logic when in the test mode. When this test boundary is defined, the module under test is operationally isolated from the other modules by isolating the input/output of bus 27. The combinatorial logic within the defined test boundary has various internal test points associated therewith, which test points provide the necessary control/observation for testing. The internal test points are of two types, serial test points accessible through the SDI and SDO, ports and arranged in a "daisy chain" configuration or parallel test points accessible through the I/O bus 20. When test vectors are loaded into the serial test points, this is referred to as "scanning". To load test vectors into the modules, parallel test vectors are loaded through the I/O bus 20 and then serial test vectors loaded through the SDI and SDO ports.

The modules 26a-26n are separately addressable to allow test vectors to be selectively scanned into a given module on the SDI line 28 to select ones of the test points with parallel data being input on the I/O bus 20 and also on dedicated interface pins 32a-32n. After the test vectors have been applied to the test points associated with the functional logic within the select module, the results are "captured" at the serial and parallel test points and the results are then scanned out on line 30 and output on the I/O bus 20 and also the output pins 32a-32n. With the system of FIG. 1, a stimulus can be applied in the form of a serial test pattern and a parallel test pattern which pattern can be selectively input within the defined test boundary. Each of these defined test boundary modules 26a-26n is addressable such that it can be separately tested. This is important in that each separate module 26a-26n may possess a different number of test points to provide the necessary control/observation in addition to a different test pattern sequence. To complete this test pattern sequence, multiple scanning operations may be required to perform the test.

If the serial test points in all of the modules 26a-26n were connected together in a single "daisy chain" configuration, this would require shifting the serial test vectors into all of the serial test points for each scan sequence. For example, if module 26a had ten serial test points in the scan path and required ten sets of scan data to facilitate a complete test and module 26b had three serial test points in the scan path and required six sets of scan data to facilitate a complete test, the daisy chain configuration would require the data to be shifted into the serial test points of module 26b an additional four times. During these additional four scans, there is no need to observe or control the serial test points in module 26b since the test for that module was completed in the first six scans. This would require the three serial test points in module 26b to be loaded and unloaded an additional four times, this time unnecessarily added onto the overall test time.

In operation, the logic circuit is first placed in the test mode and configured as illustrated in FIG. 1. This effectively isolates the modules 26a-26n from each other to allow full control thereof during testing. This prevents signals generated from other modules from being transmitted over the operational bus 27 and interfering with test results. An address is then input on the address bus 16 and one of the modules 26a-26n selected. A test clock signal is then input on the control bus along with scan data on the SDI line 28. In addition, parallel data is also input on the primary input of the selected module and then the test performed under the control of a clock signal on the control bus 12. After the test is performed, captured results are scanned out of the select module on the SDO line 30 and also from the I/O bus 20 and the associated ones of the output pins 32a-32n. These results are then analyzed external to the chip 10 and compared with valid test vectors and then another sequence of parallel and serial test vectors, if necessary, input to the select module and applied to the associated functional logic. After testing of the select module, another module is selected and the testing continued.

In addition to providing a defined test boundary for a set of functional logic with a predetermined number of serial and/or parallel points, the use of modularized functional logic groups increases the versatility and speed of initial design. Each module 26a-26n possesses a unique arrangement of both combinatorial and sequential logic. Once a test pattern is generated and debugged for a given group of functional logic within a defined test boundary, the test pattern itself is then "defined." If the logic in a given one of the modules 26a-26n is altered, or if an additional module is added, it is not necessary to alter the test patterns for the remaining modules. With the use of modularized groups of functional logic with associated test patterns, this programming time is reduced and only the portion of the test pattern for the altered module or the added module need be changed. This will be described in more detail hereinbelow.

In addition to reducing the amount of time required to scan data in and results out, the modularized defined test boundaries allow the number of gates for each test pattern to be reduced. This facilitates both fault grading and test generation. For example, if a circuit was comprised of 10,000 gates and it were divided into ten functional groups of 1000 gates each, the fault grading for each module would be reduced by a factor of approximately one hundred rather than ten. This is due to the fact that the time required for fault grading and test generation is proportional to the square of the number of gates in the circuit. Therefore, by modularizing or partitioning the circuit, fault grading can be significantly reduced.

Modularized Scan Path

Figure 2:
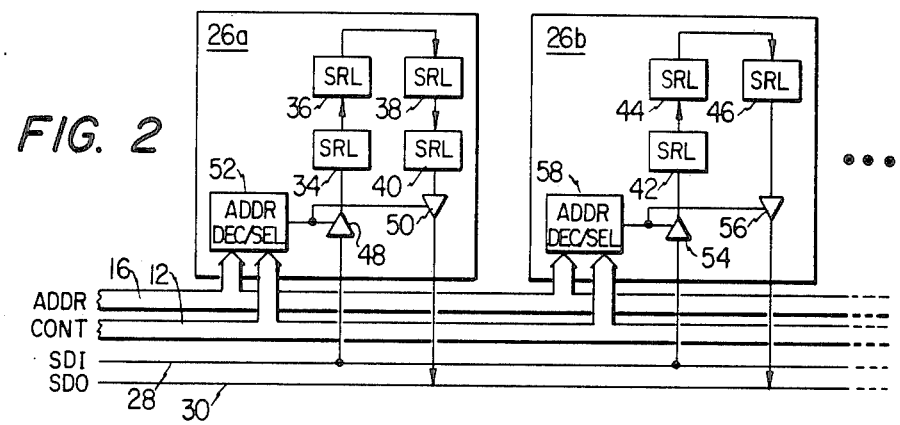
FIG. 2 illustrates a simplified schematic block diagram of the modules of FIG. 1 with a common scan in and a common scan out path interfaced with the modules.

Referring now to FIG. 2, there is illustrated a schematic diagram of two of the functional modules 26a and 26b illustrating the serial scan path therein. Each of the test points has a serial shift register (SRL) disposed thereat to allow input of data thereto for application to particular functional logic (not shown) and for the capture of test results. The module 26a by way of illustration has four SRL's 34, 36, 38 and 40 arranged in a serial path, and the module 26b has three SRL's 42, 44 and 46 arranged in series. The SRL's in the modules 26a and 26b have a predetermined relationship with functional logic (not shown) such that they constitute test points. It should be understood that any number of SRL's can be included in a particular one of the logic modules 26a-26n with the number of SRL's being defined by the particular function and the number of test points necessary to facilitate a complete test and provide the requisite control/observation.

SRL 34 in module 26a is the first SRL in the chain and has the input thereof connected to the SDI line 28 through a multiplex gate circuit 48. The SRL 40 constitutes the last SRL in the chain of SRL's and is connected to the SDO line 30 through a multiplex gate circuit 50. The gate circuits 48 and 50 are controlled by an address decode/select circuit 52 which receives an address from the address bus 16 and control signals from the control bus 12. The address decode/select circuit 52 is responsive to a select address or address select signal from the address bus 16 and also to a clock signal from the control bus 12 to interface the SRL's 34–40 with the SDI line 28 and the SDO line 30.

The module 26b is configured similar to the module 26a with an input multiplex gate 54 interfacing the first SRL 42 with the SDI line 28 and a multiplex gate 56 for interfacing the last SRL in the string 46 with the SDO line 30. An address decode/select circuit 58, similar to the decode/select circuit 52, controls the operation of the gates 54 and 56.

In operation, an address is placed onto the bus 16 to select one of the modules 26a or 26b. In one embodiment of the present invention, the address bus 16 is comprised of a plurality of module select lines, with one line connected to each of the modules. In another embodiment of the present invention, the address bus 16 inputs a digital word to each of the modules, each of the modules responsive to only one value for the digital word. Therefore, each of the modules 26a-26n can be selectively multiplexed to the SDI line 28 and SDO line 30.

After a module is selected, a predetermined number of serial data bits is input on the SDI line and the SRL's internal to the respective one of the modules 26a and 26b clocked with an externally generated test clock to shift data through the string. This is referred to as "scanning". For example, multiple clock cycles will be required to scan the serial data into all four of the serial registers 34–40. After scanning in the data, the module 26a is then controlled to apply the test vectors and capture the results in the SRL's 34–40 for later observation thereof. This data is then scanned out on the SDO line 30. Depending upon the complexity of the functional logic interfaced with the SRL's 34–40, the SRL's 34–40 may require test vectors to be scanned in and out a number of times before a complete fault test has been performed.

To perform one scan of the module 26b, it is only necessary to cycle the test clock on the control bus 12 three times to scan the data in and three times to scan data out. This sequence is repeated a predetermined number of times for the module 26b, depending upon the particular type of functional logic interfaced with the SRL's 42–46 and the test pattern that was generated for the module.

By breaking the scan path as illustrated in FIG. 2, it is possible to isolate a given group of combinatorial logic blocks with associated SRL's within the defined test boundaries of the associated module. This isolation allows each module to possess a predetermined test pattern. Once the test pattern is generated, it is not necessary to regenerate the test pattern when another module is added or one of the existing modules is altered. In addition, only the SRL's associated with a particular module must be loaded for a given sequence of test scans for that module. This allows the functional logic in one of the modules to have data scanned in and out a predetermined number of times without requiring the data to also be scanned into another module which may be less complex, thus requiring fewer scan cycles of its SRL's. This deceases the amount of time to perform the overall test.

Although the modules 26a and 26b of FIG. 2 were illustrated with gates on both the SDI port and the SDO port, it is only necessary to provide the gates 50 and 56 on the SDO ports. This would allow data to be scanned into all of the modules with the test being run on all the modules. However, the test vectors would only be valid for the select module and observation of the captured results in the select module is all that is required. Therefore, output of results from only the select module is all that is required. Test vectors scanned into unselected modules can be disregarded.

Figure 3:
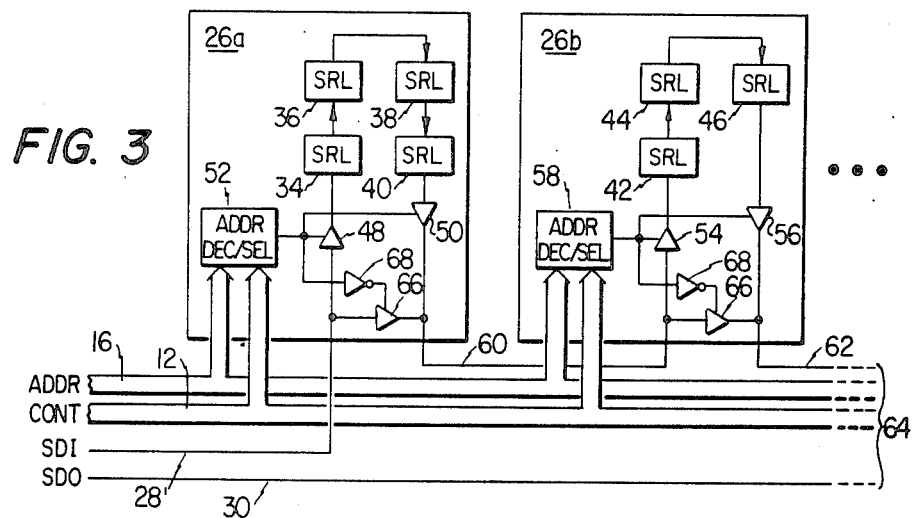
FIG. 3 illustrates a simplified block diagram of the modules of FIG. 1 illustrating an alternate method to modularize the scan paths.

Referring now to FIG. 3, there is illustrated an alternate embodiment of the modularized scan path, wherein like numerals refer to like parts in the various figures. The module 26a has the SDI input thereto connected to an SDI line 28'. The SDI input of the next adjacent module, module 26b, is connected to the SDO output of the module 38 through a serial data line 60. In a similar manner, the SDO output of module 26b is connected to the next adjacent module through a serial data line 62. The last module in the string is connected to the SDO line 30 through a serial data line 64. Each of the modules has the SDI input and the SDO output connected together with a shunt gate 66. The gate 66 has the control inputs thereof connected to the outputs of the respective address decode/select circuits 52 or 58 through inverters 68. Therefore, when not selected the gates 66 connect the SDI input to the SDO output. Only the gate 66 associated with the select one of the modules 26a–26n is opened such that associated SRL's are in series with the scan data. Therefore, the serial data must pass through each of the modules 26a–26n, but is only scanned into the SRL's of the selected module.

Parallel/Serial Scan Design

Figure 4:
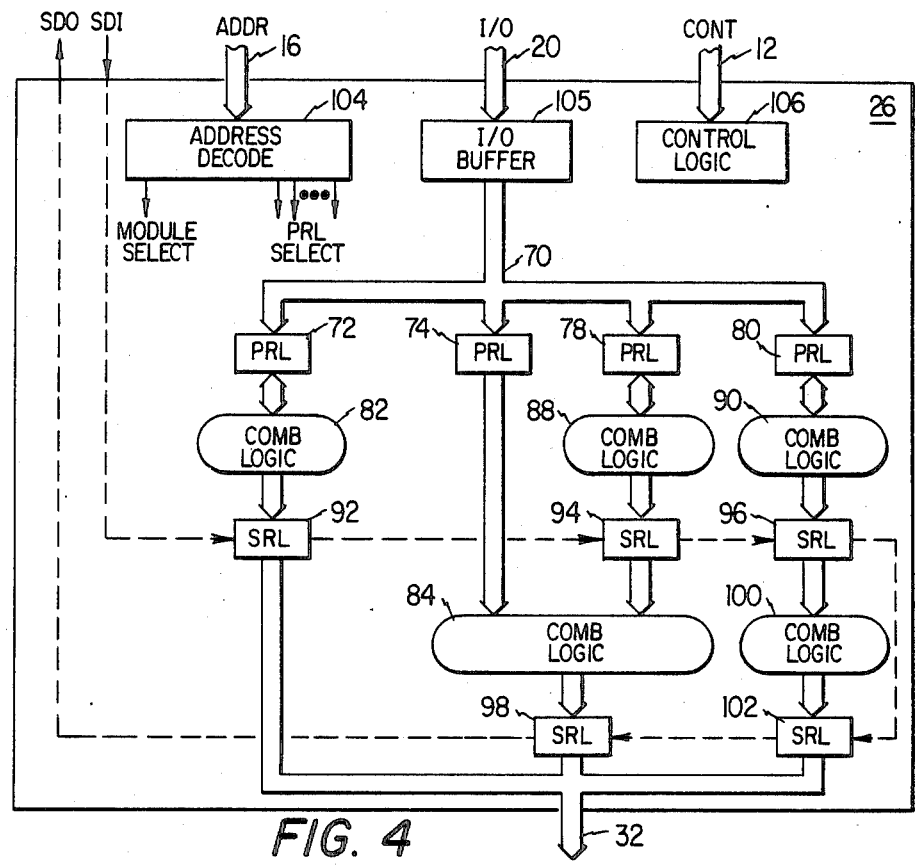
FIG. 4 illustrates a functional block diagram illustrating the combined parallel and serial scan logic design.

Referring now to FIG. 4, there is illustrated a schematic block diagram of one of the functional logic modules 26a–26n, referred to generally as module "26". The module 26 illustrated in FIG. 4 utilizes a combination of parallel register latches (PRL's) and SRL's. The data on the I/O bus 20 is interfaced with an internal data bus 70 for carrying parallel data to various locations in module 26. The internal data bus 70 is interfaced with PRL's 72, 74, 78 and 80. Each of the PRL's 72–80 is interfaced with a combinational logic circuit 82, 84, 88 and 90, respectively. For simplicity purposes, only combinatorial logic will be discussed. However, it should be understood that other types of logic such as sequential logic can also be utilized.

Each of the combinatorial logic circuits 82–90 is a multiple input, multiple output, logic network. It includes a number of levels or stages of combinatorial circuits which may take the form of conventional semiconductor logic circuits. Each network is responsive to any unique input combination of signals to provide a unique output combination of signals. The PRL's 72–80 are interfaced with respective combinatorial logic networks 82–90 to either input data to the combinatorial logic circuit or to receive data therefrom or to both input data to and receive data from the respective combinatorial logic circuits. The PRL's 72–80 therefore constitute test points.

Each of the PRL's 72–80 are addressable to selectively input data thereto or extract data therefrom and they are also controllable to suspend the data therein in order to isolate the respective combinatorial logic circuit from the internal bus 70. Therefore, each of the PRL's can be loaded with predetermined test vectors for application to the inputs or outputs of the associated combinatorial logic. This parallel loading decreases the test time for the circuit as a whole.

The various combinatorial logic circuits 82–90 associated with the PRL's 72–80 may interface with each other during normal operation of the circuit, depending upon the particular function provided by that combinatorial logic circuit. If so, it may be necessary during fault testing to isolate the various combinatorial logic circuits in module 26 in order to further control the fault testing. This is facilitated with SRL's. An SRL 92 is associated with the combinatorial logic circuit 82, an SRL 94 is associated with the combinatorial logic circuit 88, an SRL 96 is associated with the combinatorial logic circuit 90 and an SRL 98 is associated with the combinatorial logic circuit 84. An additional combinatorial logic circuit 100 receives the output of the SRL 96 with an additional SRL 102 associated therewith. The output of the SRL 94 is illustrated as being input to the combinatorial logic circuit 84 with the output of the SRL's 92–98 and 102 being interfaced with the output pins 32. Each of the SRL's 92–98 and 102 are interconnected in a serial path with the SDI and SDO ports, as illustrated by a dotted line.

Although a particular organization of PRL's, SRL's and combinatorial logic is illustrated, it should be understood that each of the SRL's merely provide a control/observation or test point within the circuit with the output thereof being directed to other combinatorial logic, another SRL, one of the PRL's or even back to the input of the combinatorial logic in a feedback path. The number of SRL's and PRL's and the location thereof is a function of the design of the circuit for testability. However, the location of the PRL's 72–80 is additionally dependent upon the circuit in the operational mode. The PRL's 72–90 may function both as parallel registers in the operational mode and parallel registers in the test mode. Therefore, each of the combinatorial logic circuits in the module 26 having PRL's associated therewith may utilize the parallel registers in the operational mode, thus utilizing already existing registers and their associated silicon area and the I/O bus that they are interfaced with in the operational mode.

With the use of a combined PRL and SRL design, it is possible to selectively input parallel data to various combinatorial logic circuits within a defined test boundary and also provide additional test points with the SRL's. The PRL's provide a much faster method of loading test vectors from the I/O bus 20. The SRL's provide a second avenue for allowing access to imbedded test points in the various combinatorial logic circuits.

Each of the modules 26 has an address decoder 104 associated therewith that is interfaced with the address bus 16. In addition, the control bus 12 is interfaced with various control logic 106. The I/O bus 20 is interfaced with the internal bus 70 through an I/O buffer 105 which can either write data to the internal bus 70 or read data therefrom. Although not illustrated as such, both the address decoder 104 and the control logic 106 are formed of combinatorial logic. Thus, they too will have SRL's associated therewith in order to provide a complete functional test of the module 26. For simplicity purposes, these SRL's are not illustrated.

The address decoder 104 is operable to receive an external address from the address bus 16 and decode this address to determine if the associated module is being selected. This is a module select signal. In addition, each of the PRL's 72–80 are addressable. In the preferred embodiment, the module select function is achieved by a dedicated module select line connected to each of the modules 26a–26n. The PRL address, however, is a binary coded word which is decoded for selection of the addressed one of the PRL's 72–80.

In loading the test pattern into the SRL's and PRL's, the PRL's are loaded first and then the SRL's. The module 26 is first selected by placing the appropriate address on the address bus 16 or selecting the appropriate module select line and then controlling the I/O buffer 105 for a read operation to interface the I/O bus 20 with the internal bus 70. This effectively connects external data to the internal data bus 70. In the preferred embodiment, this is an eight bit data word. Data is then applied to the I/O bus 20 simultaneously with the address of the desired one of the PRL's 72–80. The PRL's are arranged in register banks. For example, one PRL could be a three bit PRL whereas another PRL could be an eight bit PRL. The maximum size of the PRL addressable on the address bus 16 is equal to the maximum number of bits in the internal bus 70. The design of the test pattern determines the data or test vectors that are to be input to the particular PRL. If, for example, each of the PRL's 72–80 were an eight bit PRL, only four passes would be required to fully load thirty-two registers.

After all of the PRL's 72–80 have been written to in accordance with the test pattern, the SRL's are then loaded through the SDI port with the control logic 106 providing the scan clocks to scan the data in. Once the data is scanned in, the test clock is incremented and a test performed. During this test, test vectors can also be applied to the corresponding pins 32a–32n and results observed thereon. The test results are then captured and stored in the various PRL's and the SRL's. The I/O buffer 105 is then placed in the Read mode in addition to placing the PRL's 72–80 in the Read mode. Each of the PRL's 72–80 is then addressed and the information placed onto the internal bus 70 for output on the I/O bus 20. After the PRL's are read, the contents of the SRL's are then clocked out along the SDO port. The PRL's and SRL's are then loaded again to provide another scan cycle in accordance with the test pattern. After the predetermined number of scan cycles are complete and the results analyzed and compared to valid test vectors, the next module 26 is tested. Depending upon the complexity of each of the modules 26a–26n, one module may have a different number of PRL's and SRL's than another. By utilizing the modularized concept with a defined boundary around the combinatorial logic and the associated PRL's and SRL's, it is possible to isolate testing for each module such that unnecessary loading of SRL's in another module, due to fewer scan cycles required therein, is eliminated.

Figure 5:
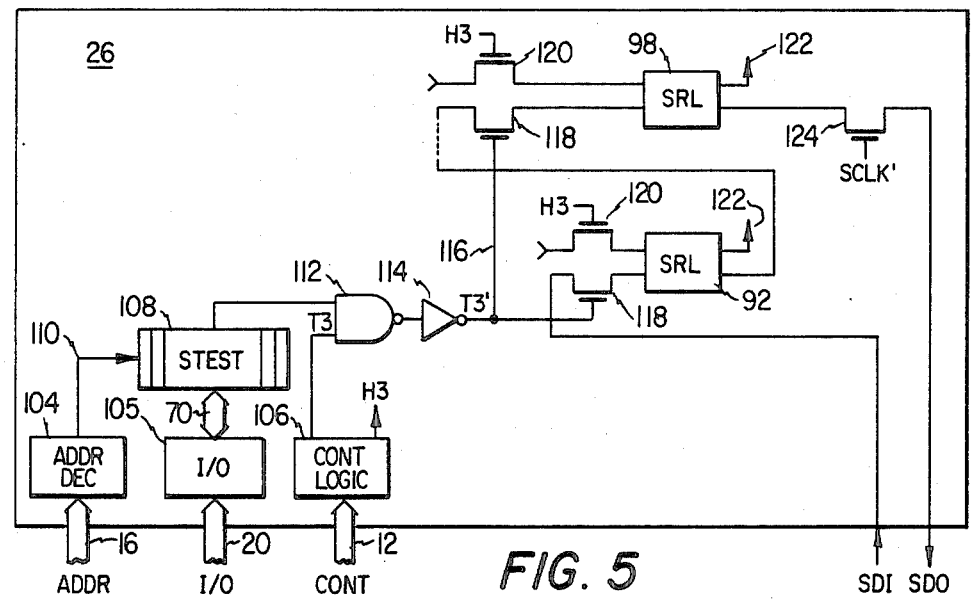
FIG. 5 illustrates a schematic block diagram of the gating circuit for selecting the scan path in each module.

Referring now to FIG. 5, there is illustrated a detailed block diagram of the module 26 of FIG. 4 illustrating the multiplexing operation for the modularized scan path of FIG. 2, wherein like numerals refer to like parts in the various figures. In order to provide control of the testing operation, a control PRL 108 is provided, which is similar to PRL's 72–80. The control PRL 108 is selected by an address decoded by the address decoder 104 with a select line 110 output therefrom to the PRL 108. Data is interfaced through the I/O buffer 105 to the internal bus 70 for input or output from the PRL 108.

The PRL 108 has one register defined as the STEST register. The STEST register is utilized for storing the STEST bit. The STEST bit is set whenever the register is selected. When the PRL 108 is selected and the STEST bit is set, this indicates the serial test mode. In order to clock serial data in, one of the lines on the control bus is the scan clock (T3) which clocks in the serial data on the SDI port. The T3 clock is input to one input of a NAND gate 112, the other input of which is connected to the STEST bit wherein the output of the NAND gate 112 is connected through an inverter 114 to a gated scan clock line (T3') 116. The T3' clock is utilized to gate information along the serial path into each of the SRL's 92–98 in the module 26.

Each of the SRL's 92–98 have two inputs, one of which is the scan input and the other of which is the regular data input. The scan data is gated in through a scan gate transistor 118 and the regular data is scanned in through a gate transistor 120. The scan transistors 118 are clocked by the T3' signal and the operational data is clocked in with the system clock HCLK, which is also input on the control bus 12. The SRL's 92–98 also provide a scan output and an operational data output. Therefore, the SRL is either in a test mode wherein data can be scanned in or out, or in an operational mode to allow the test to be run and results captured in the SRL's and then the captured results output on a scan output. The operational output is referred to by reference numeral 122. To isolate the output of the last SRL 98 and the SRL chain, an output gate transistor 124 is provided which is also gated by T3'. With the use of the output gate transistor 124, the SDO line output from the module 26 will not be connected to the common SDO line 30 unless the STEST bit is set and the T3' signal generated. The output gate transistor 124 is similar to the gate circuits 50 and 56 of FIG. 2.

Shift Register Latch

Referring now to FIG. 6, there is illustrated a schematic diagram of an SRL. The input of the SRL is connected to the gated output of the transistors 118 and 120. The gate transistor 118, as described above, provides the gated scan input to an internal node 126 and the transistor 120 provides the gated normal operational input to the node 126. This input to the gate transistor 120 is labeled REGIN. An inverter 128 has the input thereof connected to the input node 126 and the output thereof connected to a node 130. A p-channel transistor 132 has the gate thereof connected to the output of inverter 128, the source thereof connected to $V_{DD}$ and the drain thereof connected to the node 126. The transistor 132 provides a latching function when node 126 floats with respect to gating transistors 118 and 120. An inverter 134 has the input thereof connected to node 130 and the output thereof connected to an output node 136. A refresh transistor 138 is connected between node 136 and 128 and is gated by a clock signal Q2 which, as will be described hereinbelow, is a refresh clock.

In operation, a signal is gated onto node 126 by either the transistor 118 or the transistor 120. This signal appears in the inverted form on node 130 and then the noninverted form on node 136. After the logic state has been gated onto node 126, node 126 is allowed to float. Latch 132 maintains the input of the inverter 128 at the opposite state as that of the output. The refresh transistor 138 periodically connects the node 136 to the node 126 to refresh the input of the inverter 128. Since the inverter 128 in the preferred embodiment is implemented in CMOS technology, refresh is required.

Parallel Register Latch

Referring now to FIG. 7, there is illustrated a schematic diagram of the PRL. The internal bus 70 has the data line thereof associated with the PRL connected to a node 140 which is connected to one line of the internal bus 70. The node 140 is gated to a latch input node 142 through a gating transistor 144. The gating transistor 144 is gated by a PRL Write signal PRLWRT. The signal PRLWRT is a clocked Write signal which is comprised of the AND function of an external Write signal and a clock signal H3.

An inverter 146 has the input thereof connected to the node 142 and the output thereof connected to a node 148. A feedback p-channel transistor 150 is connected from the output to the input of the inverter 146 similar to the transistor 132 of FIG. 6. An inverter 152 has the input thereof connected to the node 148 and the output thereof connected to a node 154. A refresh transistor 156 is connected between nodes 142 and 154 and is gated by the Q2 clock. In order to write the information to the node 142, it is only necessary to gate the transistor 144.

The Read operation is facilitated by inverting and gating information stored on node 148 back to node 140. The node 148 is connected to the source of a p-channel transistor 158, the drain of which is connected to a node 160. An n-channel transistor 162 is connected between the node 160 and ground. The gates of both transistors 158 and 162 are connected to a PRL read signal PRLRD. The PRLRD signal is derived from the AND function of an H1 clock and an external READ signal. The node 160 is connected to the gate of an n-channel transistor 164 which is connected between the node 140 and ground.

In operation, data is written to the node 142 by gating the transistor 144 during the H3 clock cycle and information is read from the node 142 by gating the transistors 158 and 162 during the H1 clock cycle. When node 142 is allowed to float, the refresh transistor 156 maintains the information latched therein.

In some configurations, a register latch is operable to function as an input or output device. Such circuits as input/output buffers utilize the registers in this manner. The registers are merely reconfigured such that data can be received from one terminal, stored and then output in one direction. In another mode, data is received from the circuit on the input to the register for output from the device. Therefore, there is internal circuitry present to multiplex the input to the latch such that data can either be input to the register from the internal bus 70 or input to the register from the circuit itself or other locations within the circuit. However, during test it is necessary to isolate any feedback path which could possibly alter the contents of the register. This operation is referred to as the "SUSPEND" operation.

Referring further to FIG. 7, the multiplex operation is illustrated by a gate transistor 166 connected between a signal EXTIN and the node 142. The signal EXTIN represents any signal generated by the circuitry internal to the module or from any other location. The gate of the transistor 166 is connected to the output of an AND gate 168, one input of which is connected to the inverse of a SUSPEND signal and a signal H3EXTWRT. The signal H3EXTWRT represents the AND function between the H3 clock and an external write signal. The EXTWRT signal is a signal generated internal to the module during normal operation thereof. The SUSPEND signal is generated during test external of the module and is operable to isolate the input of all registers from all other circuitry and interconnections within the module 26 with the exception of the connection to the internal data bus 70 through gate transistor 144. Thereafter, data can be written to or read from the PRL with no possibility for interference from other signals which may be input to the PRL during normal operation of the circuit.

Transparent Shift Register Latch

Referring now to FIG. 8, there is illustrated a series of the modules 26a-26n that utilize a transparent SRL 170. Only the transparent SRL 170 in module 26a is illustrated in detail. For illustrative purposes, the transparent SRL 170 is incorporated into a conventional interrupt circuit. The interrupt circuit has an input line 172 and an output line 174. Each of the modules is connected in a daisy chain configuration such that the output line 174 is connected to the input interrupt line 172 of the next adjacent module. The output line 174 is connected to the REGIN input of the SRL 170 and the input line 172 is gated to the SDO output of the SRL 170. The SDO output is illustrated as being connected to one input of a multiple input AND gate 176 and also to one input of a two input NAND gate 178. The output of the NAND gate 178 is connected to output line 174 and the other input of the NAND gate 178 is connected to an interrupt signal.

The input REGIN of the SRL 170 is gated to an internal storage node 180 through a gate 182 controlled by the clock signal H3. The SDI input is gated to the storage node through a gate 184 by the scan clock signal T3. The node 180 is connected to the input of a gate 186 through an inverter 188. The output of the gate 186 is connected to a node 190, which node is connected to the input line 172 through a gate 192. The gate 192 is gated by the inverse of the STEST signal. The node 190 is connected to the SDO output through inverter 194. The gate 186 is connected to the output of a NAND gate 196, one input of which is connected to the H1 clock signal and the other input of which is connected to the STEST signal.

In operation, the gate 186 isolates the output of inverter 188 from node 190 during normal operation. During test, the gate 186 connects the output of inverter 188 to node 190 and allows either serial data to be scanned in from the SDI input to allow either loading of data or unloading of data. The gate 182 allows gating of data from the output of NAND gate 178 to allow capturing of data. Therefore, in the test mode, the transparent SRL 170 is operable to shift in the test pattern and shift out captured test data. However, in the operational mode, the input REGIN is isolated from the SDO output and an additional input is connected to the SDO output. This additional input gated to the SDO output provides a way to "asynchronously" connect an input to the circuit during normal operation and disconnect it during test operation. In addition, the SRL 170 functions to service two ports, thus reducing the number of SRL's required for interface pins.

The input and output pins illustrated as being interfaced with the SRL 170 are part of an interrupt logic daisy chain circuit. The AND gate 176 is operable to output a logic high signal whenever either the INT input goes low or the SDO output of the SRL 170 goes low. If the INT input on module 26a goes low, the output of the associated NAND gate 178 goes high, raising the output line 174 to a high. This is input to the module 26b on the input line 172. During normal operation, the input line 172 is connected through the SRL 170 to the SDO line and inverted. This places a logic low on the input of the associated NAND gate 178, thus raising the output thereof to a logic high. This continues down the chain for final output from, the module 26n. Since the transparent SRL 170 is utilized with an interrupt circuit, it is necessary that the operation be asynchronous and not clocked. Other SRL's utilized in the system require synchronization with the H3 clock during during operation of the circuit; that is, they are not transparent during normal operation. In addition, conventional SRL's must be utilized for each test point that is to be controlled/observed. With the transparent SRL 170 of the present invention, an output pin and an input pin can be controlled and observed by a single SRL.

Figure 9:
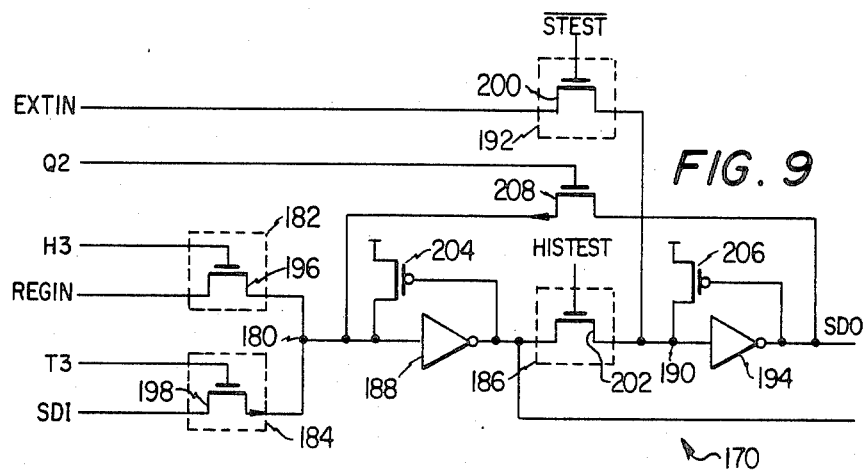
FIG. 9 illustrates a schematic diagram of the transparent SRL.

Referring now to FIG. 9, there is illustrated a more detailed block diagram of the transparent SRL 170 of FIG. 8, wherein like numerals refer to like parts in the various Figures. The gate 182 is comprised of a pass transistor 196 which is gated by the clock signal H3. The gate circuit 184 is comprised of a gate transistor 198, which is gated by the test clock signal T3. The gate circuit 192 is comprised of a pass transistor 200, gated by the inverse of STEST, and the gate circuit 186 is comprised of pass transistor 202, which is gated by the H1STEST signal output from the NAND gate 196.

To maintain the signal on the input of the inverter 188, a feedback p-channel transistor 204 is provided with the gate thereof connected to the output of inverter 186 and the source thereof connected to the input. In a similar manner, a p-channel gate transistor 206 is connected and feedback across the inverter 194. The feedback transistors 204 and 206 are similar in operation to the feedback transistor 132 of FIG. 6. In addition, a refresh transistor 208 is connected between the output of inverter 194 on the SDO line and the input of the inverter 188 on the node 180. The refresh transistor 208 is gated by the Q2 clock signal.

The circuit of FIG. 9 is operable in the normal operational mode to isolate node 180 from the SDO line and in the test mode to connect node 180 to the SDO line through gate transistor 202. In the test mode, the circuit of FIG. 9 operates similar to the SRL of FIG. 6 in that a test signal clocked on to node 180 through the gate transistor 198 appears on the SDO output. The refresh transistor 208 periodically feeds this signal level back to the input of inverter 188 to maintain the signal level thereat. Each time the gate transistor 198 is clocked by clock T3, the information is stored in the latch 170 for output therefrom. Therefore, in the test mode, a predetermined stimulus can be stored in the latch for application to a desired test point. After the serial data has been scanned in, the system is tested and the gate transistor 196 clocked to input data to the latch from the REGIN port. This allows the latch 170 to "capture" data from logic that is connected to the REGIN port. During this testing, the gate transistor 200 is open, thus isolating the EXTIN port. During normal operational mode, the EXTIN port is connected to the node 190 and to the SDO output through inverter 194. In addition, any logic input to the REGIN port is isolated from the port 190 by the gate transistor 202.

The transparent latch 170 is operable to be connected to external interface pins for testing thereof. Normally, a logic circuit which outputs information from the module 26 is normally connected to the REGIN port such that data can be connected from this logic output during test. The EXTIN port is normally connected to an input pin, which signal is received from another module in the system. Since testing of a select module does not require information from another module as this will violate the defined test boundary of each of the modules 26a–26n, this information is not available. The information is provided in the test pattern. It is necessary to isolate this port to ensure that data from one of the other modules in the system does not effect the state of any of the test points during test. In addition, when connected in normal operation, the EXTIN port is "asynchronous"; that is, data appearing on the SDO output is not a function of the H3 clock. This is especially important for such circuits as interrupt circuits and various other asynchronous operational modes of the system. The transparent SRL 170 therefor provides an SRL that services two module ports, one being an input and one being an output, with the input port being isolated during test and, in normal operation, isolating the input and output ports and allowing asynchronous input on the input port.

Figure 10:
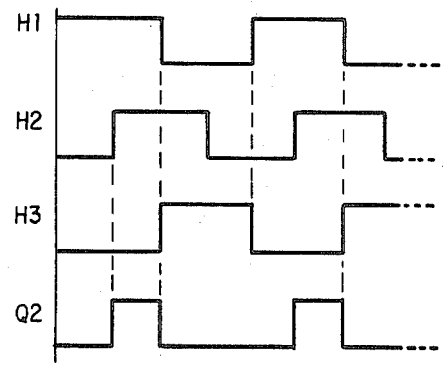
FIG. 10 illustrates a timing diagram for the clock signals.

Referring now to FIG. 10, there is illustrated a timing diagram for the clock signals. The H1 clock is a symmetrical clock which has the leading edge occurring at t=0. The H2 clock is delayed from the H1 clock by one quarter of a cycle and is a symmetrical clock signal. The H3 clock is delayed from the H1 clock by one-half cycle and is also a symmetrical clock. The Q2 clock is delayed by one-quarter cycle from the H1 clock and is asymmetrical and being present for only one-quarter of a cycle. The H1, H2 and H3 clocks are generated external to the module and the Q2 clock signal is generated internal to the module in the preferred embodiment.

Figure 11:
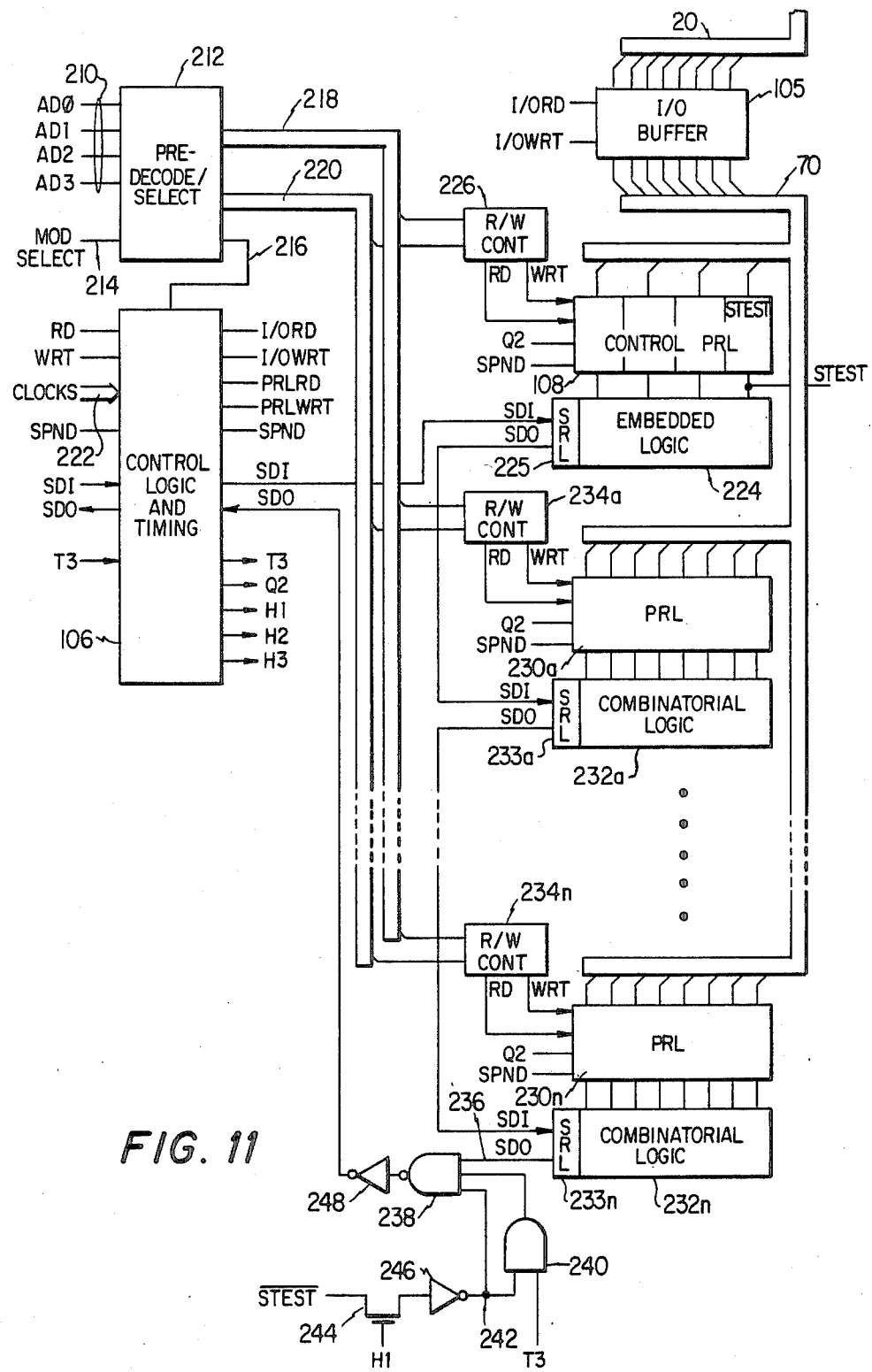
FIG. 11 illustrates a schematic block diagram of the logic module.

Referring now to FIG. 11, there is illustrated a detailed schematic block diagram of each of the modules 26a-26n. A four bit address AD0-AD3 is input on address lines 210 to a predecode/select circuit 212. In addition, a module select signal is input thereto on a line 214. In the preferred embodiment, each of the modules 26a-26n have a separate dedicated module select line interfaced therewith. An address decoder at a remote location with respect to the modules is utilized to decode an address and provide the module select line. However, it should be understood that a binary address could be input to the module and a binary decoder utilized to decode the address.

The module select line 214 is buffered in the predecode/select circuit 212 and output on a line 216 to the control logic and timing circuit 106. The address signals AD0 and AD1 are predecoded with a two-to-four decoder and output on a first predecode bus 218. The addresses AD2 and AD3 are predecoded with a two-to-four decoder and output on a second four line predecode bus 220. The address lines AD0–AD3 and the module select line are part of the address bus 16.

The control logic and timing circuit 106 receives control signals from the control bus 12 in the form of READ and WRITE signals, clock signals on a clock bus 222, a SUSPEND signal and the scanning clock T3. In addition, the control logic and timing circuit 106 is illustrated as having the scan input signal SDI and the scan output signal SDO interfaced therewith. This illustrates that the control logic and timing circuit 106 has combinatorial logic inherent thereto which may have test points provided therein which require testing. Therefore, the control logic and timing circuit 106 has internal SRL's therein which must be interfaced with the SRL chain.

The control PRL 108, which was described with reference to FIG. 5, is a four bit PRL and is interfaced with an embedded logic block 224 which comprised of both combinatorial logic and sequential logic. The embedded logic block 224 has associated therewith one or more SRL's in an SRL block 225 and may be made up of a number of logic blocks with multiple SRL's. For simplicity purposes, only the single block of embedded logic associated with the PRL will be illustrated with respect to FIG. 11. The SRL block 225 has an SDI input and an SDO output, the SDI input connected to the SCI output of the control logic block 106.

The control PRL 108 is controlled by a READ/WRITE (R/W) circuit 226 which outputs a read and a write signal to the control PRL 108. In addition, a Q2 clock signal is input thereto for refresh purposes and a SUSPEND signal (SPND) is also input thereto to provide the suspend function, if necessary. The R/W circuit 226 provides the final stage of decoding and has one input line connected to the predecode bus 218 and one select input connected to the predecode bus 220.

In addition to the control PRL 108, additional PRL's 230a-230n are interfaced with the internal bus 70. Each of the PRL's 230a-230n have the outputs thereof interfaced with associated embedded logic blocks 232a-232n, which are similar to the embedded logic block 224. Associated therewith are SRL blocks 233a-233n. The PRL's 230a-230n are controlled by R/W control circuits 234a-234n respectively. In addition, they have the SPND signal and the Q2 clock signal input thereto. It should be understood that not all PRL's operate with the suspend feature and, therefore, may not have the SPND input.

The serial test line is connected from the SDO output of the SRL block 225 to the SDI input of the SRL block 233a for interface with the internal SRL's therein. The SDO output of the SRL block 233 is connected to the next adjacent SRL block and finally to the SRL block 232n. The output of the SRL block 232n defines the end of the chain and is output on an SCO line 236.

The SDO output 236 is input to a three input NAND gate 238. The T3 clock signal is input to one input of an AND gate 240, the other input of which is connected to a node 242. Node 242 is connected to the third input of the NAND gate 238. The STEST signal is connected through a gate transistor 244 to the input of an inverter 246, the output of which is connected to a node 242. The gate transistor 242 is gated by the H1 clock. The output of the NAND gate 238 is connected through an inverter 248 to the SDO input of the control logic and timing circuit for buffering thereof and output to the SDO line.

The operation of the NAND gate 238 provides the gating function illustrated in FIG. 5 which prevents the scan output from being interfaced with the common SDO line 30 which interfaces all the modules 26a–26n. The circuit can either be interfaced with the input or with the output. However, in the preferred embodiment, it is not necessary to disconnect the SDI line that is input to each of the modules 26a–26n since it is not important what data is scanned into registers of a module not under test. It is only important what data is scanned out. Therefore, the gating circuit on the output of the SRL block 233n inhibits scan data from being output from the module unless the STEST bit is set in the control PRL 108.

To provide a test, the module select line 214 is placed at a predetermined logic state to select the module through appropriate logic in the control logic and timing circuit 106. The module select signal controls the Read and Write operation of the I/O buffer 105 and also the Read and Write operation of the various PRL's. An I/O read signal I/ORD and the I/O write signal I/OWRT are generated in response to receiving the respective Read or Write signal and the module select signal. In addition, the PRLRD and PRLWRT signal are also generated in response to receiving the read and write signals and the module select signal. However, the Read/Write control of the PRL's depend upon the address received on the lines 210.

In operation, the module select line is raised high and an appropriate PRL address applied to the lines 210. The appropriate PRL's are interfaced with the internal data bus 70 and the I/O buffer 105 placed in the write mode to pass data to the internal data bus 70 from the I/O bus 20. The appropriate data is written to the PRL and then another address selected for writing to a subsequent PRL. This is continued until all of the PRL's have the appropriate data latched thereto. During this time, the SPND signal is also activated such that all external inputs to the control PRL's 108 from other places in the circuit or from other modules are suspended and prevented from being multiplexed with the inputs, as described above with reference to FIG. 7.

After all the PRL's have been loaded, data is scanned into the SRL's according to a predetermined pattern. After the data has been scanned in, the test is run by sequencing the clocks H1-H3 and then captured results scanned out. The test results captured in the PRL's are then unloaded. If required, additional data is placed into the PRL's and SRL's and the test rerun to test other conditions.

Figure 12:
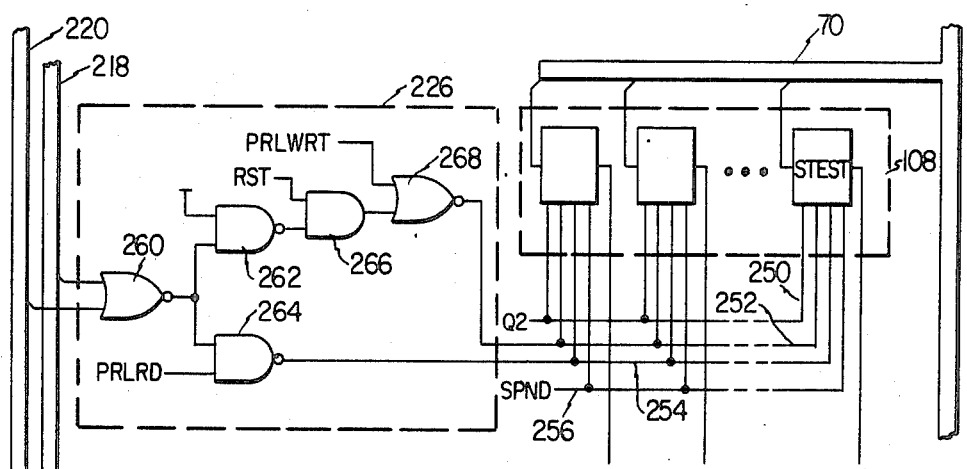
FIG. 12 illustrates a schematic diagram of the Read/Write control for controlling the PRL's.

Referring now to FIG. 12, there is illustrated a schematic block diagram of the R/W control circuit 226, which is similar to the I/O control circuits 234a–234n, and the PRL 108. Each of the registers in the PRL bank 108 have a read input, a write input, a Q2 input and a SPND input. The Q2 input is connected to a Q2 line 250, the write input is connected to a Write line 252, the read input is connected to a Read line 254 and the SPND input is connected to a Suspend line 256.

The R/W control 226 has the two select inputs from the predecode buses 218 and 220 connected to the inputs of a NOR gate 260. The output of the NOR gate 260 is connected to one input of a NAND gate 262 and one input of a NAND gate 264. The other input of the NAND gate 262 is connected to $V_{DD}$ and the other input of the NAND gate 264 is connected to the PRLRD signal output by the control logic and timing circuit 106. The output of the NAND gate 264 is connected to the Read line 254 and comprises the PRL read control signal. The output of the NAND gate 262 is input to one input of an AND gate 266, the other input of which is connected to an RST signal. The RST signal is a system reset which sets the PRL contents to active low when present. The output of AND gate 266 is connected to one input of a NOR gate 268, the other input of which is connected to the PRLWRT signal. The output of the NOR gate comprises the write control signal for the PRL 108 and is connected to the Write line 252.

In operation, the NOR gate 260 provides the final level of decoding with the generation of either the PRLWRT signal or the PRLRD signal controlling the write or read operation, respectively. The PRLWRT signal and the PRLRD signal are generated in accordance with the clock H1-H3. For example, the PRLWRT signal requires the presence of a Write signal, the H3 clock and the module select signal. The PRLRD signal requires the presence of the module select signal, the H1 clock and the READ signal. In the preferred embodiment, only a read signal is input to the module with the inverse thereof being WRITE such that only one input is required for two different states.

In summary, there has been provided a scan test system which utilizes partitioned modules which enclose a plurality of SRL's and/or PRL's therein within a defined boundary. Each of the modules, from a test standpoint, is independent from the other modules. Therefore, a separate test pattern can be generated for each module and each module can be tested separate from each other module, thus reducing both the time to complete a total test of the system and also the time for generating the test pattern.

Although the preferred embodiment has been described in detail, it should be understood that various changes, substitutions and alterations can be made therein without departing from the spirit and scope of the invention as defined by the appended claims.

What is claimed is:

1. A testable logic circuit, comprising:
   a plurality of modules each having a defined test boundary, each of said modules comprising:
   internal logic circuitry;
   control/observation means disposed at a plurality of control/observation locations within said internal logic circuitry for applying test vectors to said control/observation locations within said internal logic circuitry, and for storing results at said control/observation location;
   serial means for interconnecting said control/observation means in a serial chain, said serial means having a test input and a test output; and
   interface means for connecting said test input of said serial means to a serial input terminal for receiving test vectors from the exterior of the logic circuit and for selectively connecting said test output of said serial means to a serial output terminal for outputting results after testing to the exterior of the logic circuit; and
   address means for selecting one of said modules in accordance with an external module address signal and for controlling the interface means in said selected one of said modules to connect said test output of said serial means associated with said selected module to said serial output terminals
   so that vectors may be applied to said control/observation locations of said associated internal logic circuitry and so that results of the operation of said internal logic circuitry stored at said control/observation locations after said test vectors have been applied may be output.

2. The logic circuit of claim 1 wherein said address means comprises:
   an address bus for carrying said module address to each of said modules; and
   decode means associated with each module for decoding said module address and outputting a select signal in response to decoding a predetermined one of said module addresses, said interface means responsive to said select signal.

3. The logic circuit of claim 1 wherein each said interface means is also for selectively isolating said test input of said serial means for said serial input terminal;
   and wherein said addressing is also for controlling the interface means in each of said unselected ones of said modules to isolate said test input of said serial means associated with said unselected modules from said serial input terminals.

4. The logic circuit of claim 1 wherein each said interface means comprise:
   an isolation gate disposed in series with the test output of said serial means and said serial output terminal, said isolation gate being responsive to said address means to allow results to be serially output from said control/observation locations in said selected module.

5. A testable logic circuit comprising:
   a serial input terminal;
   a serial output terminal;
   a plurality of modules each having a defined test boundary, said modules arranged in a serial chain, and each of said modules comprising:
   internal logic circuitry;
   control/observation means disposed at a plurality of control/observation locations within said internal logic circuitry for applying test vectors to said control/observation locations within said internal logic circuitry, and for storing results at said control/observation locations;
   a serial input node;
   a serial output node;
   serial means for interconnecting said control/observation means in a serial chain, said serial means having a test input and a test output, and
   interface means for connecting said test input of said serial means to said serial input node to receive test vectors and for selectively connecting said test output of said serial means to a serial output terminal to output results after testing;

address means for selecting one of said modules in accordance with an external module address signal and for controlling the interface means in said selected one of said modules to connect said test output of said serial means associated with said selected module to said serial output node; an input serial data line connected between the serial input terminal and the serial input node of the first one of said modules in said module serial chain;

a plurality of intermediate serial data lines, one of said intermediate serial data lines disposed between the serial output node of each module except the last module in said serial chain and the serial input node of the adjacent one of said modules in said module serial chain;

an output serial data line connected between the serial output node of the last of said modules in the module serial chain and the serial output terminal;

wherein each of said interface means is also for selectively connecting the intermediate serial data line connectable to the serial output node of the prior module in the module serial chain to the serial output node of the module associated with said interface means, responsive to said address means;

and wherein said address means is also for enabling each of said interface means associated with modules which are not selected by said address means, such that serial data is serially shunted through the interface means of unselected ones of said modules to directly input serial data to said test input of the serial means in said selected one of said modules.

6. The logic circuit of claim 5 wherein: each said interface means comprises:
  a shunt gate circuit, controlled by said address means, for connecting the serial input node to the serial output node in response to said said address means not selecting its module; and
  an isolation gate, controlled by said address means and disposed between the test output of said serial means and the serial output node, for connecting said test output to said serial output node in response to said address means selecting its module.

7. The logic circuit of claim 1 wherein said control/observation means comprises a latch disposed at each of said control/observation locations for having data clocked therethrough, said latch having a gated test input, a gated normal operating input and an output, the normal input and the output interfaced with said associated logic circuit for normal operation, the test input and the output interfaced with said serial means for inputting test vectors to said associated control/observation location and outputting results therefrom, said control means controlling said gated test input and said gated normal operating input.

8. The logic circuit of claim 7 wherein said serial means comprises a serial data link inconnecting the output of each of said latches to the test input of the next adjacent one of said latches, the first of said latches having the test input thereof interfaced with the test input of said serial means and the last of said latches in said serial chain being interfaced with the test output of said serial chain.

9. The logic circuit of claim 1 wherein said control/observation means comprises a serial shift register latch disposed at each of said control/observation locations and having a gated test input, a gated normal operating input and an output, the normal input and the output interfaced with said internal logic circuitry for normal operation;

wherein said serial means comprises:
  a serial data link for interfacing the gated test inputs and the outputs of said shift register latches in a serial chain;
  a test input for inputting test vectors;
  a test output for outputting test vectors; and
  means for controlling said shift register latches to serially shift input test vectors through said serial data link, apply said test vectors to said associated logic and output results from said shift register latches through said serial data link to said serial output terminal.

10. The logic circuit of claim 9 wherein said interface means comprises an isolation gate disposed in series with the test output of said serial data link and the serial output terminal and responsive to selection of said associated module by said address means to connect results from said shift register latches to said serial output terminal.

11. A testable logic circuit, comprising:
  a plurality of modules each having a defined test boundary, each of said modules having internal logic with a plurality of control/observation locations;
  a serial shift register latch disposed at each of said control/observation locations and having a gated test input, a gated normal operating input and an output, the normal input and the output interfaced with said associated logic circuits for normal operations;
  a serial data link associated with each of said modules for interfacing the gated test inputs and the outputs of said shift register latches in a serial chain having a test input for inputting test vectors thereto and a test output for outputting test results therefrom;
  interface means for interfacing the test input of said serial chain with a module serial input on said associated module and a test input of said serial chain with a module serial input on said associated module;
  an input serial data line connected between a common serial input to the logic circuit and serial module input of one of said modules, the remaining of said modules arranged in a serial chain;
  intermediate serial data lines disposed between the serial module output and the serial module input of each of the adjacent ones of said module;
  an output serial data line disposed between the last of said modules in the chain and a common serial output for the logic circuit; and
  a shunt gate circuit associated with each module for connection between the serial module input thereof and the serial module output thereof, said shunt gate circuit operable in response to said associated module being unselected to shunt serial data from said associated module of serial inputs and outputs.

12. The logic circuit of claim 11 wherein said interface means comprises an isolation gate associated with each of said modules and disposed between the test input of said serial data link and the serial module output thereafter inhibit output of results therefrom when said module is unselected, the test input of said serial chain connected directly to said associated serial module input such that serial data being input to the select one of said modules can be directly input thereto and may be output through said common serial output can be output only from said select modules.

13. A method for testing logic circuitry, comprising:
segmenting the logic circuitry into modularized logic circuits with defined test boundaries, each modularized logic circuit have a plurality of control/observation locations associated therewith;
disposing a shift register latch at each of the control/observation locations, the shift register latch having a gated test input, a gated normal operating input and an output, the gated operating input and the output interfaced with the associated modularized logic circuits;
arranging the test input and the output of the shift register latches within each of the defined boundaries in a serial chain interfaced with a serial module input and a serial module output associated with each of the defined test boundaries;
selecting one of the defined test boundaries and the modularized logic circuitry therein for testing;
interfacing the serial module input of the select test boundary with a common serial input and the serial module output thereof with a common serial output such that serial data can be input into the shift register latches of the select test boundary through the common serial input and serial data output from the shift register latches of the select test boundary through the common serial output; and
controlling the logic circuit to isolate the gated input of the shift register latches from the associated modularized logic circuit and load test vectors through the common serial input to the serial module input of a select one of the defined boundaries for loading into the associated shift register latches, applying the test vectors to the associated logic circuitry and outputting test results from the serial module output of the select one of defined boundaries after test, the test vectors generated in accordance with a predetermined test pattern.

14. The method of claim 13 wherein the step of interfacing comprises:

connecting each of the serial module inputs of the defined test boundaries with the common serial input;
connecting each of the serial module outputs of the defined test boundaries with the common serial output; and
inhibiting output of results from the serial chain of shift register latches in each of the defined boundaries when the defined boundary is unselected such that results are only output from the select one of the defined boundaries.

15. The method of claim 14 wherein the step of inhibiting comprises disposing an isolation gate between the last shift register in the serial chain of shift register latches within each of the defined test boundaries and gating the isolation gate to a conduction state in response to selection of the associated defined boundary.

16. The method of claim 13 wherein the step of interfacing comprises:
arranging each of the defined test boundaries in a serial chain;
connecting the serial module input of the first of the defined test boundaries to the common serial input;
connecting the serial module inputs of the intermediate defined test boundaries with the serial module output of the adjacent defined test boundary;
connecting the serial module output of the last of the defined test boundaries in the chain to the common serial output;
shunting the serial module input to the serial module output of each of the defined test boundaries when unselected; and
inhibiting output of the results from the shift register latches in each of the defined test boundaries to the serial module output thereof when unselected such that test vectors input on the common serial input are shunted through unselected ones of the defined test boundaries for direct input into the select one of the defined test boundaries and test results are output only from the select one of the defined test boundaries and shunted rough the remaining ones of the defined test boundaries between the select ones thereof and the common serial output.

* * * * *